(12) United States Patent
Shenoy

(10) Patent No.: US 6,441,470 B1
(45) Date of Patent: Aug. 27, 2002

(54) TECHNIQUE TO MINIMIZE CROSSTALK IN ELECTRONIC PACKAGES

(75) Inventor: Jayarama N. Shenoy, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/935,125

(22) Filed: Aug. 21, 2001

(51) Int. Cl.$^7$ ............................................... H01L 21/44
(52) U.S. Cl. .................... 257/659; 257/664; 257/691
(58) Field of Search ............................ 257/659, 664, 257/691, 723, 724, 758

(56) References Cited

U.S. PATENT DOCUMENTS 5,994,766 A * 11/1999 Shenoy et al. ............... 257/659

* cited by examiner

Primary Examiner—Hoai V. Ho
Assistant Examiner—Mai-Huong Tran
(74) Attorney, Agent, or Firm—O'Melveny & Myers LLP

(57) ABSTRACT

The present invention is a technique to minimize crosstalk in multilayer IC packages. According to one or more embodiments of the present invention, signal routing layers are separated by planes for power and ground. Signal trace routing on the routing layers follows either horizontal, vertical or diagonal directions for obtaining high routing densities in the package as is the present design practice. The power and ground planes in one embodiment of the present invention are constructed as a mesh having groups of colinear perforations. The groups are oriented at an arbitrary angle that is chosen to minimize the crossings of groups of signals over mesh openings. It is guaranteed that the number of mesh openings that any given set of three traces encounters is reduced by at least a factor of two. Thus the present invention reduces crosstalk in the package by approximately 50%.

6 Claims, 6 Drawing Sheets

TECHNIQUE TO MINIMIZE CROSSTALK IN ELECTRONIC PACKAGES

BACKGROUND OF THE INVENTION

1. Field of the Invention

The present invention relates to the field of integrated circuit packaging and technology.

2. Background Art

An integrated circuit (IC) is a microelectronic semiconductor device consisting of many interconnected transistors and other components. ICs are generally fabricated on one or more small rectangles cut from a semiconductor material, such as silicon. A multilayer IC generally consists of one or more signal routing layers separated by metal planes for power and ground. This multilayer arrangement is named a multilayer laminate package.

Multilayer laminate packages are subject to a problem called "crosstalk" due to the nature of their construction. Before further discussing the problems associated with crosstalk, a typical multilayer laminate package is described below.

Multilayer Laminate Package

FIG. 1 illustrates a typical multilayer laminate package configuration 100. Signal routing layer 120 is in contact with ground layer 110 and Vcc layer 130. Signal routing layer 120 has a plurality of trace routing lines that connect the pins of the package to the semiconductor die. The construction and use of these components is well known to those of skill in the art. Ground layer 110 is dedicated to full system ground and chassis ground. Vcc layer 130 is in contact with signal routing layer 140. Vcc layer 130 carries voltage signal Vcc to the components on signal routing layer 120 and signal routing layer 140. Signal routing layer is in connection with ground layer 150. Thus, multilayer laminate packages are designed so that multiple signal routing layers are sandwiched between ground planes and Vcc planes. The signal routing traces are composed of segments oriented at zero degrees, forty-five degrees, ninety degrees and one-hundred-and-thirty-five degrees to any edge of the package.

For reasons relating to the manufacturing process, Vcc layer 130 and ground layer 110 generally need to have a perforated mesh pattern. The mesh size is large compared to the width of the traces used for routing signals. For example, typical dimensions currently used are twenty to fifty microns for the signal trace width, and one-hundred-and-fifty to four-hundred microns for of the mesh openings. The mesh planes are laid out on a grid and that grid usually follows a vertical-horizontal direction.

Crosstalk

A major consideration in multilayer laminate package design is the minimization of crosstalk. Crosstalk refers to interference between signal routing lines. It is undesirable because it contributes to errors on the signals propagated in the traces. Crosstalk is due to electromagnetic (inductive) or electrostatic (capacitive) coupling between the conductors carrying the signals. The longer two or more parallel signal traces run together, the higher the crosstalk is as between those lines. Also, crosstalk is directly proportional to the distance between signal traces. Crosstalk between adjacent traces on the same layer is the dominant crosstalk contribution in a package. This coupling is very strongly influenced by the presence of a solid plane above or below. Studies have shown that crosstalk between traces with no plane can be three to ten times higher than otherwise.

Crosstalk can be reduced by shielding the signal trace lines from one another and increasing the distance between them. Thus, in a typical multilayer IC configuration, the signal trace lines on adjacent signal routing layers are insulated by the mesh layer sandwiched between these planes. Thus, crosstalk between adjacent signal routing layers is a lesser problem. When groups of signals traverse multiple mesh openings, the crosstalk between traces on different layers also increases significantly due to the absence of a solid plane between them. This is also a cross talk issue in electronic package design that arises from the use of mesh planes.

The usual technique of minimizing package crosstalk is to push the package substrate design rules to minimize the diameter of the mesh openings in the solid planes. This involves tweaking the package manufacturing process to minimize the impact of reduced adhesion of various layers in the package and requires a requalification of certain aspects of the package. These tests include the use of thermal cycling to check integrity. Very often, the tradeoff results in a compromise between package reliability criteria and the level of induced crosstalk.

Furthermore, the insertion of mesh openings on the Vcc and ground layers is a postprocessing step in package fabrication. The placement of perforations into a conducting layer is decided after the first design of the package. Therefore, the package design must necessarily be reviewed and modified to mitigate the most extreme cases of groups of signal trace lines traversing mesh openings. The prior art crosstalk minimization method lengthens the package design process. Further, package redesign and subsequent retesting significantly add to the project cost.

SUMMARY OF THE INVENTION

The present invention is a technique to minimize crosstalk in multilayer IC packages. According to one or more embodiments of the present invention one or more signal routing layers are separated by planes for power and ground. Signal trace routing on the routing layers follows either horizontal (0 degrees), vertical (90 degrees) or diagonal (45 and 135 degrees) directions for obtaining high routing densities in the package as is the present design practice.

The power and ground planes in one embodiment of the present invention are constructed as a mesh having numerous perforations. The directionality of the mesh pattern is set diagonally to the horizontal and vertical axes. In one embodiment, the axes of the perforations follow a 30 degree–120 degree orientation. In another embodiment, the axes of the perforations are set to follow a 60 degree–150 degree orientation. By setting the orientation of the mesh to follow either diagonal, it is guaranteed that the number of mesh openings that any given set of three traces encounters is reduced by at least a factor of two. Thus the present invention reduces crosstalk in the package by approximately 50%.

Since the insertion of mesh openings is an automated post-processing step, the implementation of the present invention requires only a modification of design software. Therefore, the invention does not increase the total cost of the package.

DETAILED DESCRIPTION OF THE INVENTION

The present invention is a technique to minimize crosstalk in multilayer laminate packages. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Multilayer Integrated Circuit

Figure 1:
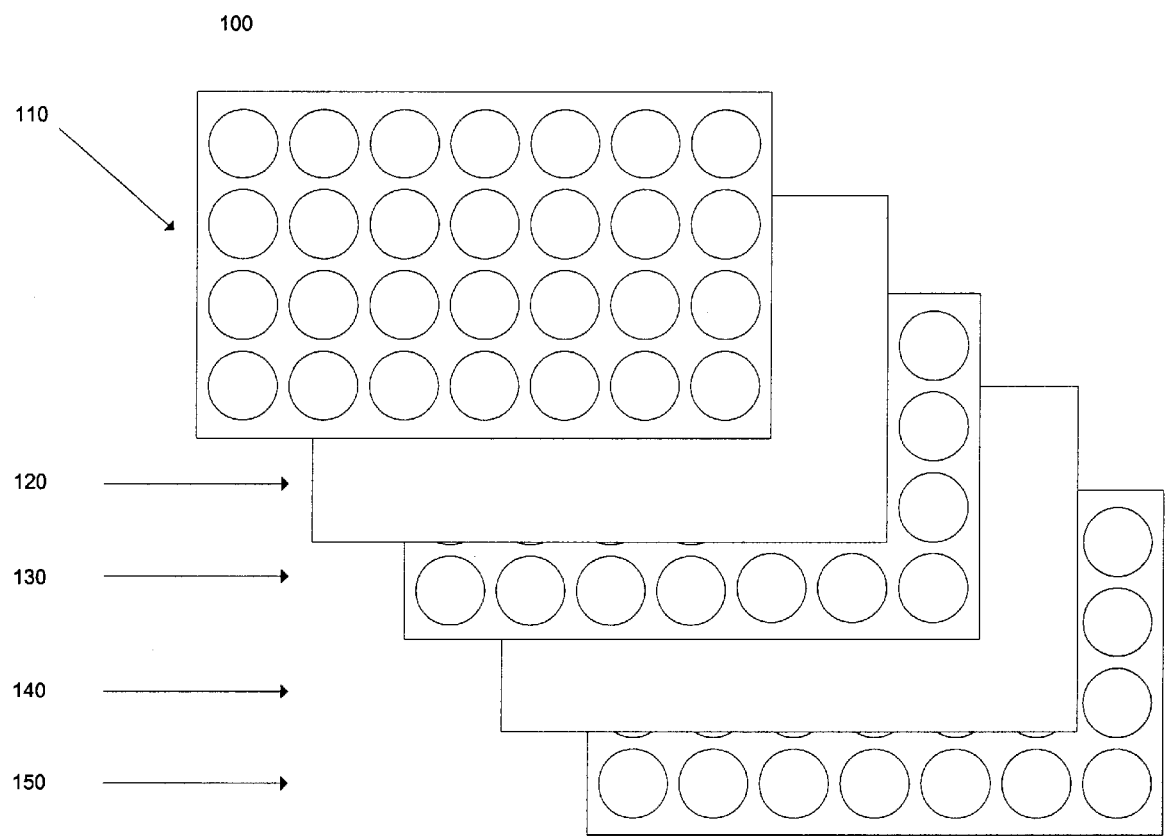
FIG. 1 is an illustration of a typical multilayer laminate package configuration.
Figure 2:
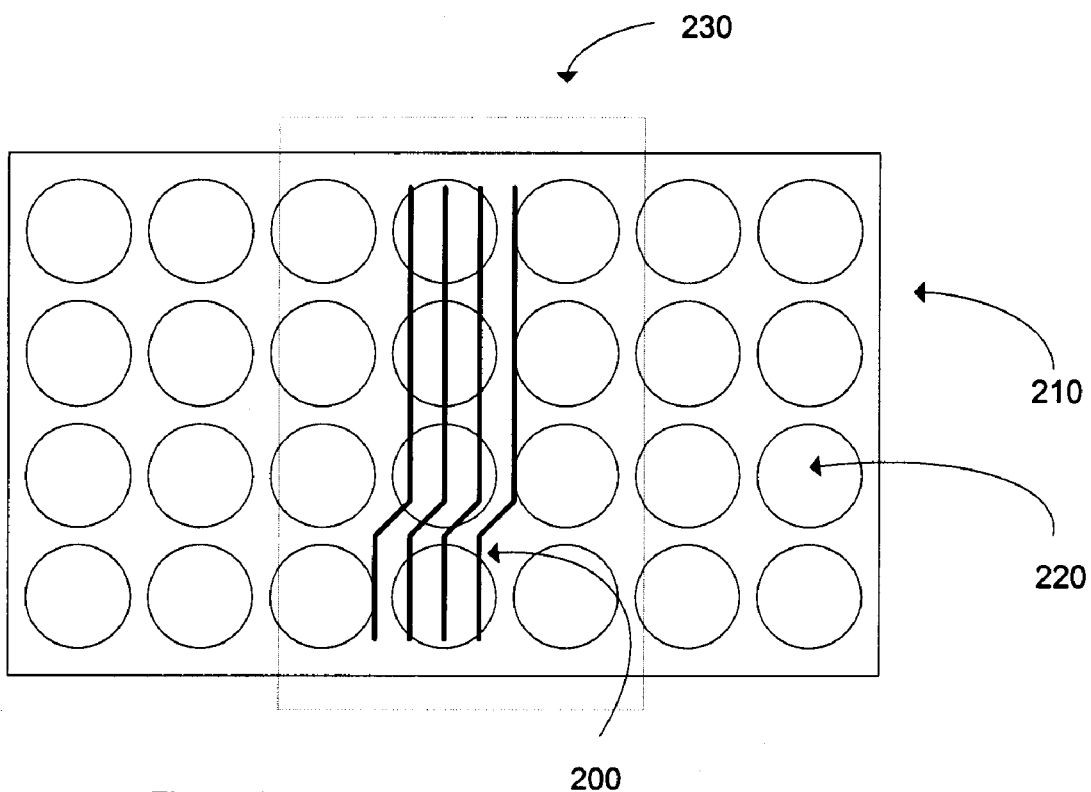
FIG. 2 illustrates a typical prior art multilayer IC configuration.

FIG. 2 illustrates a typical prior art multilayer integrated circuit. Signal routing layer 230 has a plurality of signal trace lines 200. Signal trace lines 200 are comprised of segments oriented at zero degrees, forty-five degrees, or ninety degrees to horizontal. This is done to increase density in the package by making it easier to keep more signal traces closer together. Signal routing layer 230 is attached to mesh layer 210. Mesh layer 210 is a solid conductor incorporating a plurality of perforations 220 therein.

As the signal trace lines 200 encounter perforations 220, crosstalk is generated between trace lines 200. This is due to the absence of a solid plane in mesh layer 210 next to trace lines 200.

Figure 3A:
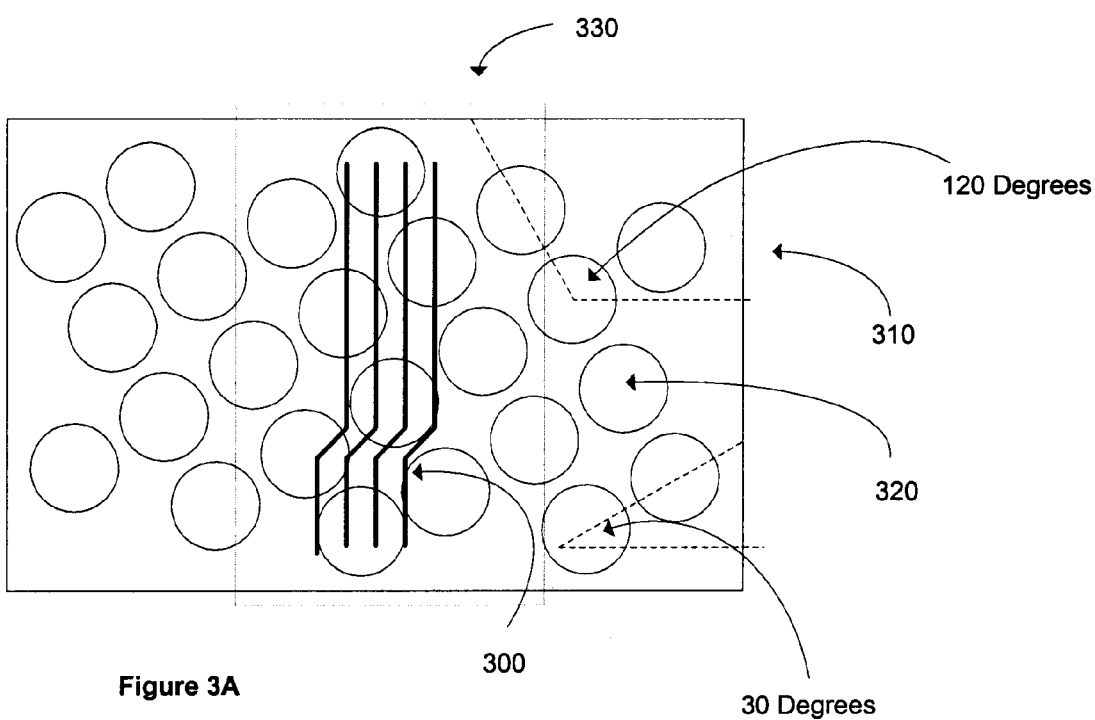
FIG. 3A illustrates an embodiment of the present invention where the axes of perforations are oriented at 30 degrees and 120 degrees with respect to horizontal.

One embodiment of the present invention minimizes crosstalk as shown in FIG. 3A. In FIG. 3A, signal routing layer 330 has a plurality of signal trace lines 300. Signal trace lines 300 are comprised of segments oriented at zero degrees, forty-five degrees, or ninety degrees to horizontal. Signal routing layer 330 is attached to incongruent mesh layer 310. Incongruent mesh layer 310 is a solid conductor incorporating a plurality of perforations 320 therein. The axes of perforations 320 run along a direction that is neither parallel nor perpendicular to the orientations of the segments comprising signal trace lines 300 in signal routing layer 330. Perforations 320 are oriented at thirty and one-hundred-and-twenty-degrees with respect to any edge of the IC package. Thus, the rotation of mesh layer 310 with respect to horizontal creates a mesh whose perforations 320 are incongruent with respect to the orientations of the segments comprising signal trace lines 300. This incongruity increases the solid area of mesh plane 310 encountered by routing lines 300.

Figure 3B:
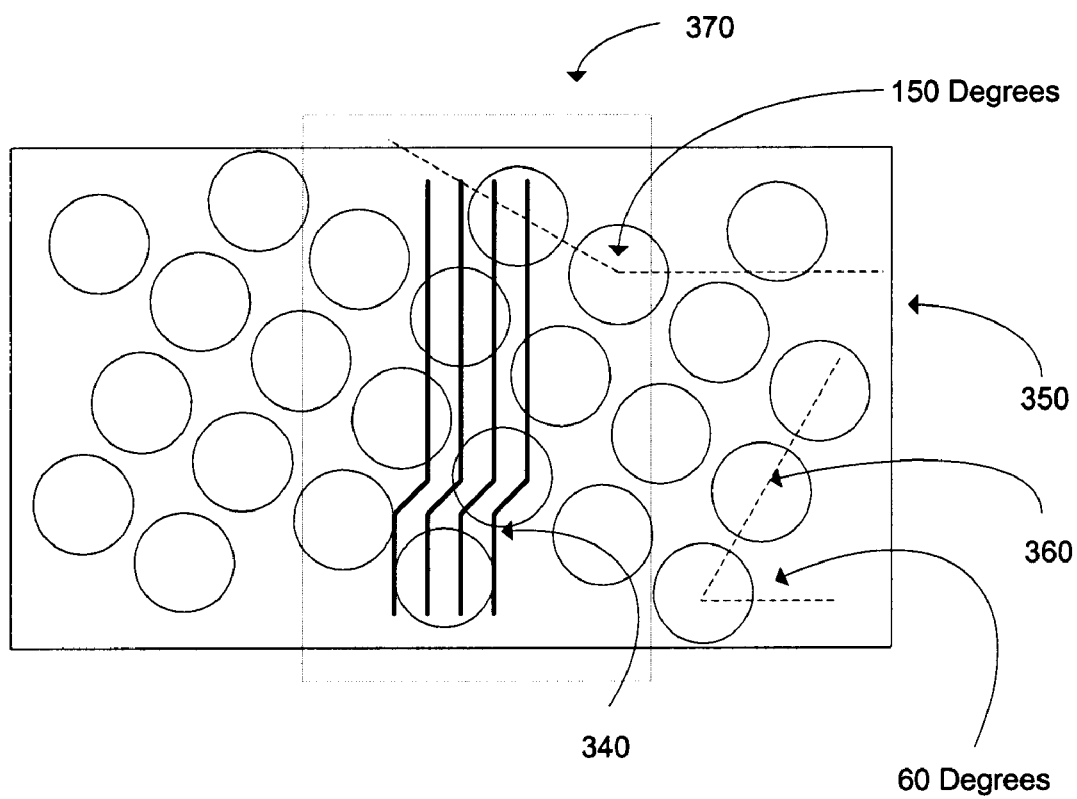
FIG. 3B illustrates an embodiment of the present invention where the axes of perforations are oriented at 60 degrees and 150 degrees with respect to horizontal.

Another embodiment of the present invention is shown in FIG. 3B. There, signal routing layer 370 has a plurality of signal trace lines 340. Signal trace lines 340 are comprised of segments oriented at zero degrees, forty-five degrees, or ninety degrees to horizontal. Signal routing layer 370 is attached to incongruent mesh layer 350. Incongruent mesh layer 350 is a solid conductor incorporating a plurality of perforations 360 therein. The axes of perforations 360 run along a direction that is neither parallel nor perpendicular to the orientations of the segments comprising signal trace lines 340 in signal routing layer 370. Perforations 360 are oriented at sixty and one-hundred-and-fifty-degrees with respect to any edge of the IC package. Thus, the rotation of mesh layer 350 with respect to horizontal creates a mesh whose perforations 360 are incongruent with respect to the orientations of the segments comprising signal trace lines 340. This incongruity increases the solid area of mesh plane 350 encountered by routing lines 340.

The use of an incongruent mesh layer lowers the number of mesh openings that a group of signal trace lines will encounter. Thus, the extent to which groups of signal traces travel over areas without a solid conductor immediately adjacent to them is reduced, lowering crosstalk. By changing the orientation of the mesh to follow either the thirty degree–120 degree or the sixty degree–150 degree orientations, it is guaranteed that the number of mesh openings that any given set of three traces encounters is reduced by at least a factor of two. This reduces crosstalk in the package by approximately 50%.

The embodiments shown in FIGS. 3A and 3B are for purposes of example only. One skilled in the art will note that by using an incongruent mesh, crosstalk will be minimized. Accordingly, other embodiments of the present invention use meshes with arbitrary angles that are not parallel to any orientation of the signal lines.

Figure 4:
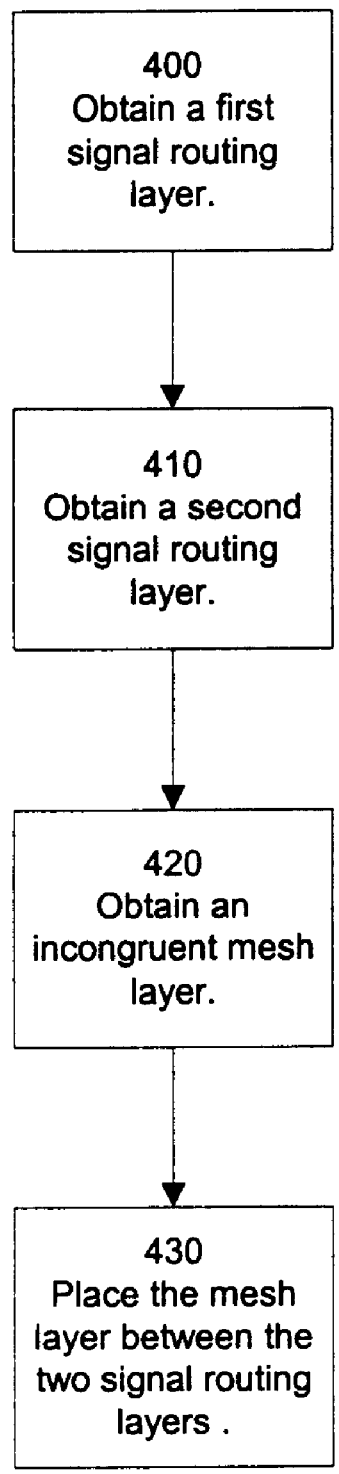
FIG. 4 illustrates a method of practicing the present invention.

FIG. 4 is a block diagram illustrating a multilayer laminate integrated circuit construction method in accord with the present invention. In block 400, a first signal routing layer is obtained. In block 410, a second signal routing layer is obtained. An incongruent mesh layer is obtained in block 420. This layer may either carry Vcc or ground the package. In block 430, the mesh layer is placed between the first signal routing layer and the second routing layer.

Figure 5:
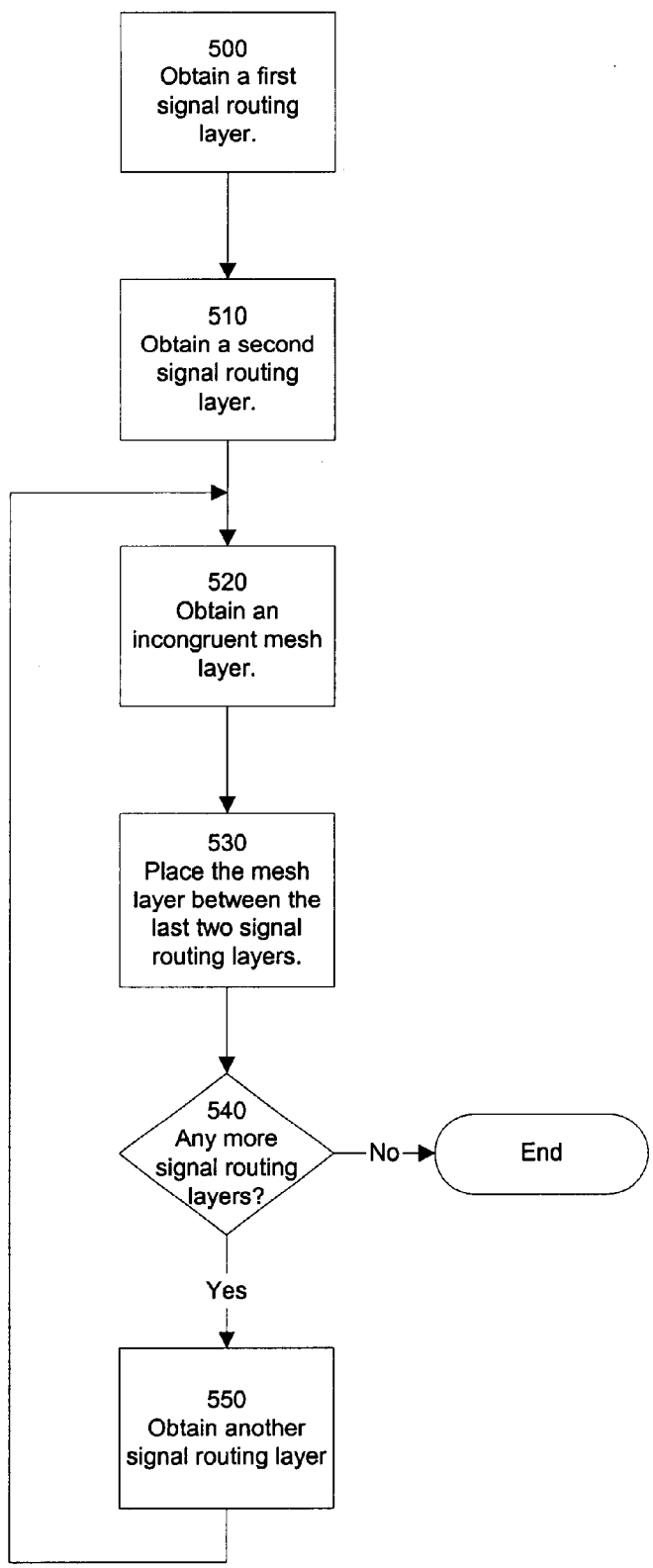
FIG. 5 illustrates a method of practicing the present invention wherein the iterative nature of chip construction is made explicit.

FIG. 5 is a block diagram illustrating the iterative nature of the multilayer laminate integrated circuit construction process in accord with the present invention. In block 500, a first signal routing layer is obtained. In block 510, a second signal routing layer is obtained. An incongruent mesh layer is obtained in block 520. This layer may either carry Vcc or ground the package. In block 530, the mesh layer is placed between the first signal routing layer and the second routing layer.

Decision block 540 determines whether any remaining signal routing layers must be attached to the existing construct. A negative determination indicates that integrated circuit construction is complete; the process ends.

A next signal routing layer is obtained in block 550 if the result of decision block 540 is positive. The process then iterates at block 520 and an incongruent mesh layer is obtained for continued package construction.

Thus, a technique to minimize crosstalk in electronic packages has been described.

I claim:

1. An integrated circuit comprising:
   a first layer having first signal lines; and
   a mesh layer adjacent to said first layer wherein said mesh layer has a pattern comprising colinear groups of openings disposed at an angle to an edge of said mesh layer.

2. The integrated circuit of claim 1, further comprising:
   a second layer having second signal lines, wherein said mesh layer is adjacent to said second layer and said mesh layer is between said first layer and said second layer.

3. The integrated circuit of claim 2 wherein said first signal lines and said second signal lines are oriented at 0 degrees, 45 degrees, 90 degrees, or 135 degrees with respect to a horizontal axis defined by said edge of said mesh layer.

4. The integrated circuit of claim 3 wherein the angle of the colinear groups of said pattern is 30 degrees.

5. The integrated circuit of claim 3 wherein the angle of the colinear groups of said pattern is 60 degrees.

6. The integrated circuit of claim 3 wherein the colinear groups of said pattern are oriented at an arbitrary angle that is chosen to minimize the crossings of groups of said first signal lines and groups of said second signal lines over said openings.

* * * * *